United States Patent [19]

Raudabaugh

[11] Patent Number: 4,899,248
[45] Date of Patent: Feb. 6, 1990

[54] MODULAR ELECTRICAL ASSEMBLIES WITH PLASTIC FILM BARRIERS

[75] Inventor: Donald E. Raudabaugh, Wadsworth, Ohio

[73] Assignee: Hubbell Incorporated, Orange, Conn.

[21] Appl. No.: 176,319

[22] Filed: Mar. 31, 1988

Related U.S. Application Data

[63] Continuation-in-part of Ser. No. 33,765, Apr. 3, 1987, which is a continuation-in-part of Ser. No. 681,800, Dec. 14, 1984, Pat. No. 4,656,555.

[51] Int. Cl.$^4$ .............................................. H02H 1/04
[52] U.S. Cl. .................................... 361/127; 361/117; 338/21
[58] Field of Search ............... 361/117, 120, 126–128, 361/130, 119; 174/178, 150, 140 R; 338/21, 71, 99, 113, 317–320

[56] References Cited

U.S. PATENT DOCUMENTS

| T102,103 | 8/1982 | Lenk ..................................... 361/118 |
| 2,050,334 | 8/1936 | Kellogg . |
| 2,586,285 | 2/1952 | Ackerman . |
| 2,587,587 | 3/1952 | Bellezza et al. ..................... 174/140 |
| 2,593,955 | 4/1952 | Ackermann . |
| 2,802,175 | 8/1957 | Eldridge . |
| 2,866,135 | 12/1958 | Cunningham . |
| 2,947,903 | 8/1960 | Westrom .............................. 361/126 |
| 2,997,529 | 8/1961 | Fink ..................................... 174/138 |
| 3,018,406 | 1/1962 | Innis .................................... 361/128 |
| 3,261,910 | 7/1966 | Jacquier .............................. 174/178 |
| 3,412,273 | 11/1968 | Kennon et al. ...................... 361/127 |
| 3,524,107 | 8/1970 | Reitz .................................... 361/127 |
| 3,567,541 | 3/1971 | Kaczerginski ...................... 156/172 |
| 3,581,154 | 5/1971 | Willox . |
| 3,586,934 | 6/1971 | Nakata ................................ 361/329 |
| 3,631,323 | 12/1971 | Pittman . |
| 3,706,009 | 12/1972 | Reitz .................................... 361/127 |
| 3,725,745 | 4/1973 | Zisa ..................................... 317/104 |
| 3,735,019 | 5/1973 | Hess et al. . |
| 3,835,439 | 9/1974 | Yonkers ................................. 339/19 |
| 3,850,722 | 11/1974 | Kreft .................................... 156/172 |
| 3,869,650 | 4/1975 | Cunningham et al. ............. 361/128 |
| 3,898,372 | 8/1975 | Kalb . |
| 3,973,172 | 8/1976 | Yost ....................................... 317/61 |
| 3,987,343 | 10/1976 | Cunningham et al. ............. 317/61.5 |
| 4,029,380 | 6/1977 | Yonkers ............................... 339/60 R |
| 4,092,694 | 5/1978 | Stetson ................................. 361/126 |
| 4,100,588 | 7/1978 | Kresge ................................. 361/127 |
| 4,107,567 | 8/1978 | Cunningham et al. ............. 313/325 |
| 4,161,012 | 7/1979 | Cunningham ...................... 361/128 |
| 4,218,721 | 8/1980 | Stetson ................................. 361/117 |
| 4,298,900 | 11/1981 | Avdeenko ........................... 361/127 |
| 4,404,614 | 9/1983 | Koch et al. ...................... 361/117 X |
| 4,456,942 | 6/1984 | Bronikowski ....................... 361/127 |
| 4,467,387 | 8/1984 | Bergh et al. ......................... 361/132 |
| 4,491,687 | 11/1985 | Kaczerginski et al. ............. 174/178 |
| 4,566,183 | 2/1971 | Olsen et al. ........................... 315/36 |
| 4,656,555 | 4/1987 | Raudabaugh ................... 361/119 X |

FOREIGN PATENT DOCUMENTS

| 44650 | 1/1974 | Australia . |
| 683681 | 4/1964 | Canada . |
| 3001943 | 7/1981 | Fed. Rep. of Germany . |
| 551832 | of 1925 | France .............................. 174/150 |
| 282485 | 12/1974 | U.S.S.R. . |
| 730710 | 5/1955 | United Kingdom . |
| 1109151 | 4/1968 | United Kingdom . |
| 1505875 | 3/1978 | United Kingdom . |
| 2188199 | 9/1987 | United Kingdom . |

OTHER PUBLICATIONS

Siemens Journal of Apr. 1963, No. 4, pp. 269–272.

*Primary Examiner*—Todd E. Deboer
*Attorney, Agent, or Firm*—Jerry M. Presson; Mark S. Bicks; Alfred N. Goodman

[57] ABSTRACT

An electrical device includes a plurality of electrical assemblies formed as interchangeable modules, aligned in an end-to-end serial array and enclosed in a polymeric weathershed housing, the electrical assemblies being electrically and mechanically coupled together. Each electrical assembly in turn has a plurality of electrical components aligned in a row and in electrical connection with one another via their axially-directed ends and under an axially-directed compressive force via a non-conductive filament winding. A plastic film barrier laterally surrounding the electrical components is interposed between the electrical components and the filament winding. A surge arrester with voltage ratings can be enlarged merely by serially coupling a plurality of separately wrapped electrical components in the form of MOV blocks. Enclosing the electrical assemblies is a weathershed housing.

22 Claims, 2 Drawing Sheets

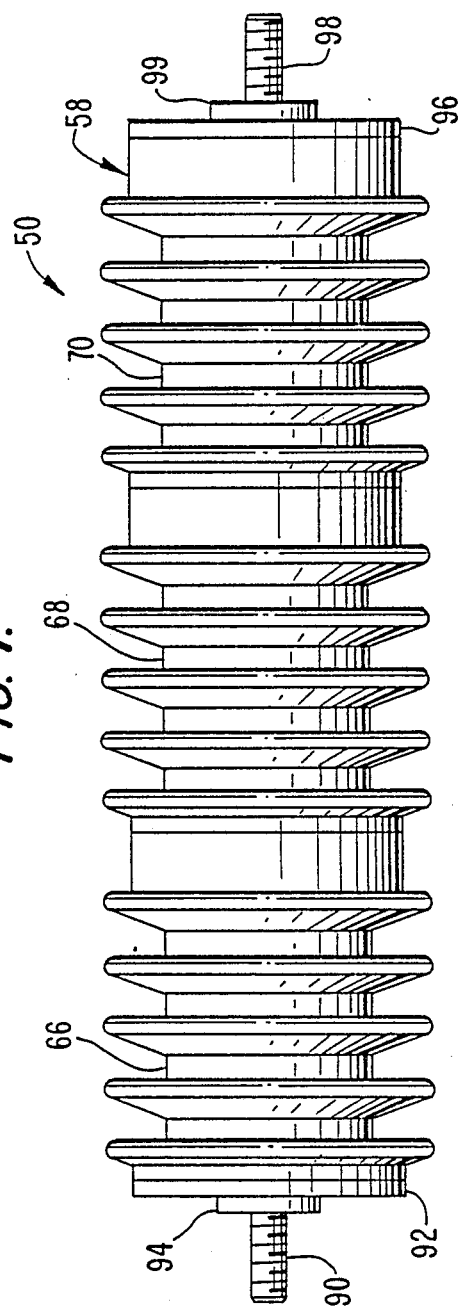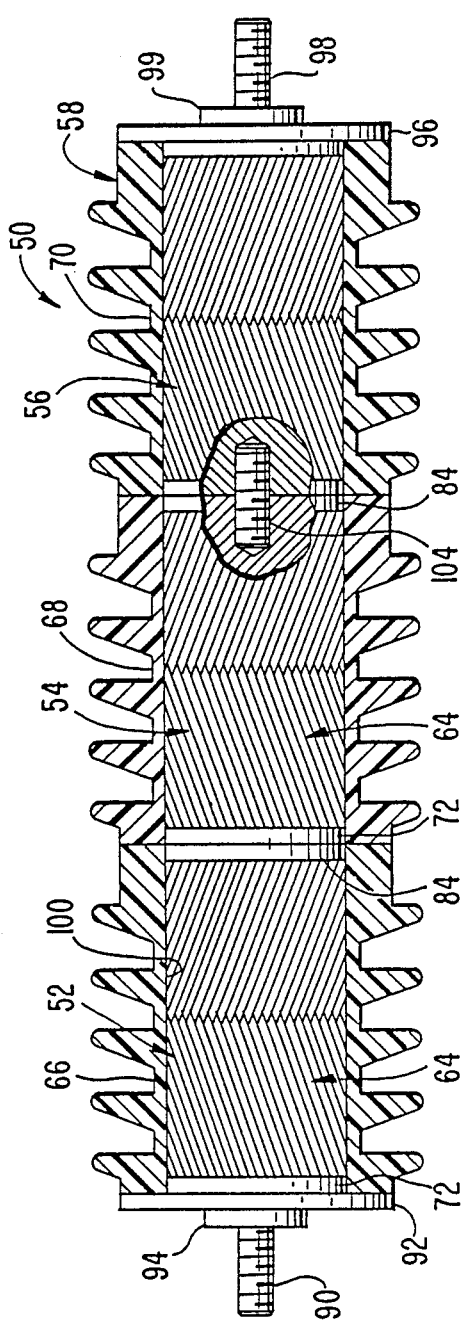

MODULAR ELECTRICAL ASSEMBLIES WITH PLASTIC FILM BARRIERS

RELATED APPLICATIONS

This application is a continuation-in-part of application Ser. No. 033,765, filed Apr. 3, 1987, which is a continuation-in-part of application Ser. No. 681,800, filed Dec. 14, 1984, now U.S. Pat. No. 4,656,555.

FIELD OF THE INVENTION

The present invention relates to polymer housed electrical assemblies which are formed as modules and which are selectively coupled together to vary the overall electrical rating of the device. Each electrical assembly is formed from electrical components that are first wrapped in a plastic film barrier and are then wrapped in a non-conductive filament winding. The components can be varistors, resistors, capacitors, or any combination thereof.

BACKGROUND OF THE INVENTION

A surge protector or arrester is commonly connected across a comparatively expensive piece of electrical equipment to shunt over-current surges. Such over-current surges occur, for example, when lightning strikes. When this happens, the surge arrester shunts the surge to ground, thereby protecting the piece of electrical equipment and the circuit from damage or destruction.

Present day surge arresters commonly include an elongated, hollow cylindrical housing made of porcelain or the like, and a plurality of non-linear resistive blocks within the housing. Some of these structures also include spark gaps, the blocks and gaps being electrically interconnected to handle voltage and current surge conditions arising on a power line. The blocks commonly contain silicone carbide (SIC) or metal oxide varistors (MOV), and are usually in the shape of relatively short cylinders stacked within the arrester housing. The number of blocks employed is a function of the material (SIC or MOV) and the voltage and current ratings of the assembly.

For a surge arrester to function properly, intimate contact must be maintained between the MOV or SIC blocks. This necessitates placing an axial load on the blocks within the housing. Prior art arresters utilize bulky contact springs within the housing to provide this axial load. Typically, these springs can provide only relatively small loads, for example, about sixty pounds. As a result, prior art surge arresters experience one or more problems such as poor heat transfer between the MOV or SIC blocks and arrester terminals; non-uniform current distribution; and high contact resistances at joints. Furthermore, units having low contact force sputter and the ionized metal which is produced can cause axial flashover at high currents.

An additional problem with surge arresters of the prior art is that they, on rare occasions, fail in a dangerous fashion. When these arresters fail and experience high fault currents, the bursting unit may throw parts and cause property damage.

In addition, some of the prior art devices are difficult to assemble, have poor dielectric design, are susceptible to water invasion, and require totally different devices to provide varied voltage ratings.

Examples of prior art surge arresters are disclosed in the following U.S. Pat. Nos.: 2,587,587 to Bellezza et al.; 2,947,903 to Westrom; 2,997,529 to Fink; 3,018,406 to Innis; 3,261,910 to Jacquier; 3,412,273 to Kennon et al.; 3,524,107 to Reitz; 3,566,183 to Olsen; 3,567,541 to Kaczerginski; 3,586,934 to Nakata; 3,706,009 to Reitz; 3,725,745 to Zisa; 3,850,722 to Kreft; 3,973,172 to Yost; 3,987,343 to Cunningham et al.; 4,029,380 to Yonkers; 4,092,694 to Stetson; 4,100,588 to Kresge; 4,107,567 to Cunningham et al.; 4,161,012 to Cunningham; 4,218,721 to Stetson; 4,404,614 to Koch et al.; 4,467,387 to Bergh et al.; 4,491,687 to Kaczerginski et al.; and U.S. Defensive Pub. No. T102,103, as well as U.K. patent Nos. 730,710; 1,109,151; and 1,505,875.

In the surge arresters of U.S. Pat. No. 4,656,555 and U.S. patent application Ser. No. 033,765, the subject matters of which are hereby incorporated by reference, the resin soaked glass filaments directly engage and bond to the varistor blocks. This can damage the relatively fragile ceramic insulating collars on the varistor blocks during manufacture. Commonly assigned and concurrently filed U.S. patent application Ser. No. 176,317 entitled Modular Electrical Assemblies with Pressure Relief of John D. Sakich discloses a surge arrester having a filament wrap with openings and a barrier between the electrical components and the filament wrap.

SUMMARY OF THE INVENTION

Accordingly, an object of this invention is to provide electrical devices, particularly surge arresters, which are relatively simple and inexpensive to assemble without damaging the electrical components, have good dielectric design, resist water invasion, and have modular components and housings to simply vary voltage ratings.

A further object of this invention is to provide electrical assemblies, such as surge arresters, having high axial loadings, thereby resulting in uniform current distribution, low contact resistances at joints, and excellent heat transfer to the arrester terminals.

Another object of this invention is to provide an electrical assembly, such as a surge arrester, having a shatter-proof housing which has a high-impact strength and which does not fail in a dangerous fashion.

Still another object of this invention is to provide a MOV block assembly with greatly improved tensile and cantilever strengths.

Yet another object of this invention is to provide a surge arrester which is forgiving of dimensional variations in associated parts, thereby reducing the need for expensive close tolerances.

The foregoing objects are basically attained by providing a modular electrical assembly or an electrical device formed of modular electrical assemblies, wherein each electrical assembly includes a plurality of electrical components aligned in a row or column and electrically connected through their axially directed ends, a plastic film barrier laterally surrounding the electrical components, and a non-conductive filament winding wrapped about the plastic film and electrical components. The winding applies an axially directed compressive force on the electrical components to maintain their electrical connection.

Other objects, advantages and salient features of the invention will become apparent from the following detailed description, which, taken in conjunction with the annexed drawings, discloses a preferred embodiment of the invention.

BRIEF DESCRIPTION OF THE DRAWINGS

Referring to the drawings which form a part of this original disclosure:

FIG. 1 is a side elevational view of an electrical device in the form of a surge arrester, in accordance with the present invention, including a plurality of modular and interchangeable filament wrapped electrical assemblies enclosed in a weathershed housing;

FIG. 2 is a side elevational view in partial longitudinal section of the device illustrated in FIG. 1 showing the electrical assemblies including the filament windings inside the weathershed housing;

DETAILED DESCRIPTION OF PREFERRED EMBODIMENT

Figure 3:
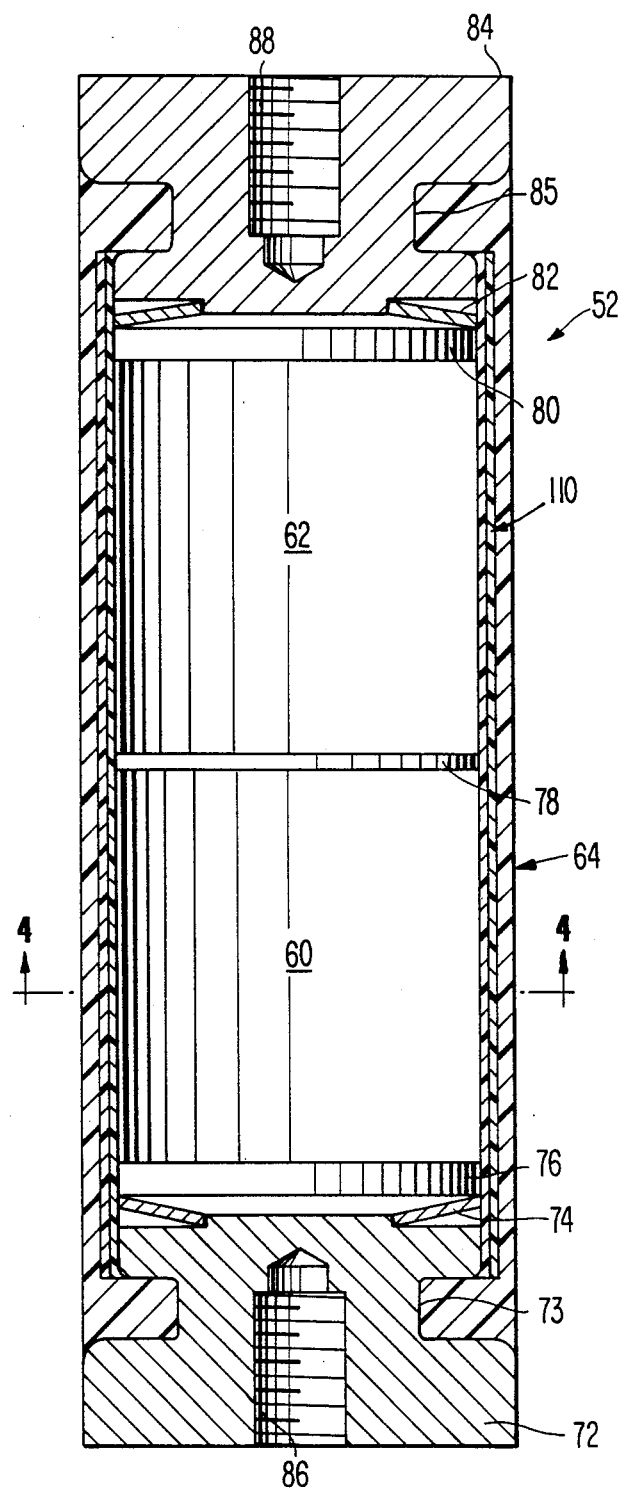
FIG. 3 is an enlarged side elevational view in longitudinal section of one modular electrical assembly shown in FIG. 2.

Referring to FIGS. 1-4, an electrical device 50, in the form of a surge arrester, according to the present invention is formed of a plurality of modular electrical assemblies 52, 54 and 56 enclosed in a polymeric, elastomeric weathershed housing 58. Each of the electrical assemblies is advantageously substantially identical to and interchangeable with the other electrical assemblies, and is in turn formed from a plurality of cylindrical electrical components 60 and 62. These components are aligned in a row, and are in electrical connection with one another through their axially-directed ends and under an axially-directed compressive force developed by a non-conductive filament winding 64, as disclosed in U.S. Pat. No. 4,656,555 and Ser. No. 033,765. The electrical components can be metal oxide varistors (e.g., zinc oxide varistor blocks), resistors, capacitors, or any combination thereof. While only two electrical components are shown in FIG. 3, more than two can be used.

In the case of varistors used to form a surge arrester, voltage ratings can be enlarged merely by serially and selectively coupling the plurality of modular electrical assemblies together mechanically and electrically.

The elastomeric weathershed housing 58 can be one section of polymeric material or a plurality of sections 66, 68 and 70 in an end-to-end aligned serial array as seen in FIGS. 1 and 2. These sections receive the electrical assemblies therein via a slight interference fit and therefore facilitate construction and allow the practice of good dielectric design by reducing radial gaps.

Figure 4:
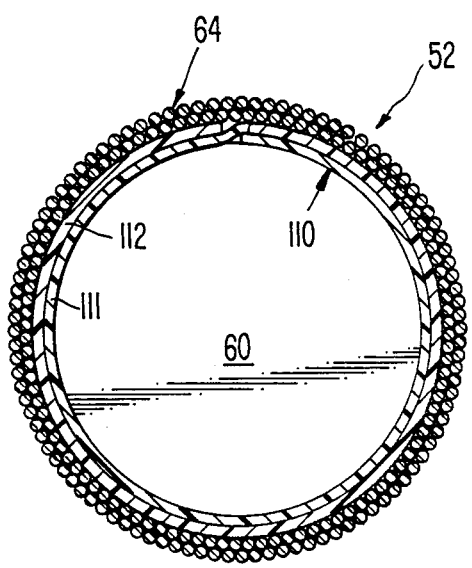
FIG. 4 is an enlarged end elevational view in section taken along line 4—4 of FIG. 3.

Each of the electrical assemblies 52, 54 and 56 are substantially the same, so only assembly 52 illustrated in FIGS. 3 and 4 will be described in detail. Assembly 52 has a substantially cylindrical overall outer surface and comprises first end member, or terminal 72, spring washer 74, contact disc 76, electrical component 60, contact disc 78, electrical component 62, contact disc 80, spring washer 82, and second end member, or terminal 84. The non-conductive filament winding 64 is coupled to end members 72 and 84 via reception in peripheral grooves 73 and 85 respectively therein, encloses the electrical components, and maintains them under an axially-directed force, which is augmented by the spring washers.

A plastic film barrier 110 laterally surrounding electrical components 60 and 62 is interposed coaxially between the electrical components and filament winding 64. Preferably, the plastic is polypropylene. The barrier is formed by wrapping a rectangular plastic sheet tightly about the electrical components and the adjacent portions of end members 72 and 84, i.e., those portions axially inside of grooves 73 and 85, in two layers 111 and 112 before filament winding 64 is added. The thickness of the plastic sheet and of each layer is about 0.0005 inch.

Since the plastic film barrier extends along the entire length of the electrical components and onto the end members, the plastic film barrier seals the electrical components from the epoxy or resin on the filament forming the winding. For surge arresters, this prevents the wet epoxy or resin on the filament from bonding to the fragile ceramic insulating collars on the metal oxide varistor blocks 60 and 62.

All of the parts comprising electrical assembly 52 are conductive, except the film barrier and the winding, unless the components are insulators. Advantageously, end members 72 and 84 are formed from aluminum. The exposed outer surfaces of the filament winding 64 and the end members 72 and 84 are all substantially cylindrical and have substantially equal diameters.

End members 72 and 84 form internal terminals, have cylindrical exposed outer surfaces, and have opposite, first and second axially-directed planar ends with internally threaded sockets or bores 86 and 88 formed respectively therein. Socket 86 threadedly receives threaded end stud 90 which can be connected to an electrical power source and is in the form of a metallic, conductive shoulder bolt. End plate 92 is received on end stud 90, tightly engages an end of the weathershed housing as seen in FIGS. 1 and 2 and is held in place via rigid shoulder 94 on the stud. A second end plate 96 is similarly positioned at the other end of the housing and is received on end stud 98 which is connected to ground and maintained thereon via shoulder 99 on the stud. Studs 90 and 98 in essence form external terminals for the overall device 50.

Weathershed housing section 66 has a through passageway in the form of a throughbore with an inwardly facing cylindrical surface 100 which tightly receives therein the outer cylindrical surface of the electrical assembly 52. The same is true regarding sections 68 and 70 and assemblies 54 and 56. The reception of the assemblies in the throughbore is preferably via an interference fit with the assemblies having outer surface diameters that are substantially equal to one another and from about 2% to about 9% greater than the throughbore diameter, which is substantially constant along its length. This reduces radial gaps and thus provides advantageous dielectric design.

To mechanically and electrically connect the three electrical assemblies 52, 54 and 56 together in an aligned, straight end-to-end serial array, a pair of externally threaded, metallic, and conductive studs 104 are used, as seen in FIG. 2. These studs are advantageously substantially identical and interchangeable, as well as substantially rigid and formed of stainless steel. Stud 104 couples the adjacent ends of adjacent assemblies 54 and 56 by being threadedly received in the threaded sockets in each assembly's adjacent end member. The same is true regarding for the stud coupling adjacent assemblies 52 and 54. The adjacent ends of adjacent assemblies are screwed tightly together on the studs to provide a substantially gap-free engagement between the facing planar, axially-directed outer ends of the end members thereon. This provides an advantageous electrical and mechanical interface by reducing possible separation during bending of the device. If more assemblies are used, additional studs are added to connect them, with the addition of any necessary weathershed housing sections, or use of a larger, one-piece housing.

To provide sealing against water invasion, preferably a neoprene gasket is interposed between each adjacent stud shoulder and end plate, and silicone grease is interposed between each adjacent end plate and end member, between adjacent end members, and between the outer surfaces of the electrical assemblies and the inwardly facing surfaces of the throughbore in each weathershed housing section. Use of grease between the weathershed housing section and the electrical assembly aids in construction and assembly by reducing friction and also reduces any radial gaps therebetween.

Advantageously as seen in FIGS. 1 and 2, the longitudinal axes of the studs 90, 104, and 98; the electrical components in each assembly 52, 54 and 56; and the weathershed housing 58 are coaxially aligned. Preferably, the planar ends of the end members are perpendicular to these aligned longitudinal axes.

Preferably, with regard to the electrical device 50, the axial load on the electrical components before winding is about 750 pounds per square inch, and the filament or stranded element of fibers is wet epoxy coated fiberglass which is wound through about 100 turns and is cured for about two hours at 150° C.

While a particular embodiment has been chosen to illustrate the invention, it will be understood by those skilled in the art that various changes and modifications can be made therein without departing from the scope of the invention as defined in the appended claims.

What is claimed is:

1. A modular electrical assembly, comprising:
   a plurality of conductive electrical components, aligned in a column along an axis and having axially directed ends, said electrical components being electrically connected at said axially directed ends;
   a plastic film barrier laterally surrounding and tightly engaging said electrical components;
   first and second conductive end members located at opposite ends of said column, said end members having shoulders extending radially relative to said axis; and
   a non-conductive filament winding wrapped about said plastic film barrier, said electrical components and said end members, engaging said shoulders and applying an axially directed compressive force through said shoulders on said electrical components and end members to maintain electrical connection therebetween, said plastic film barrier separating said non-conductive filament winding from said electrical components.

2. A modular electrical assembly according to claim 1 wherein said film is polypropylene.

3. A modular electrical assembly according to claim 1 wherein said filament winding comprises wet epoxy coated fiberglass.

4. A modular electrical assembly according to claim 3 wherein said non-conductive filament winding is wrapped about said electrical components and said end members while said electrical components and said end members are axially compressed.

5. A modular electrical assembly according to claim 1 wherein said plastic film comprises a plastic sheet wrapped about said electrical components.

6. A modular electrical assembly according to claim 4 wherein said plastic film comprises two superimposed layers.

7. A modular electrical assembly according to claim 5 wherein each said layer is about 0.0005 inch thick.

8. A modular electrical assembly according to claim 1 wherein said electrical components are varistors.

9. A modular electrical assembly according to claim 8 wherein said varistors are generally cylindrical metal oxide varistors.

10. A modular electrical assembly according to claim 1 wherein said film barrier extends over and surrounds a portion of each of said end members between said shoulder thereof and an end face thereof adjacent said components.

11. A modular electrical assembly according to claim 10 wherein said electrical components are generally cylindrical varistor blocks; and said end members are generally cylindrical, said varistor blocks and said end members having substantially equal transverse diameters.

12. An electrical device, comprising:
    a plurality of electrical assemblies oriented in an end-to-end serial array, each electrical assembly having first and second ends;
    end means, coupled to each pair of adjacent electrical assemblies, for electrically and mechanically coupling each adjacent pair of electrical assemblies, said mechanical coupling resisting relative axial movement between said electrical assemblies;
    watershed means, enclosing said assemblies, for protecting said assemblies; and
    terminal means coupled to each of the two electrical assemblies at opposite ends of said serial array;
    each of said electrical assemblies including
    a plurality of conductive electrical components aligned in a column along an axis and being electrically connected through axially-directed ends thereof,
    a plastic film barrier laterally surrounding and tightly engaging said electrical components,
    first and second conductive end members coupled to said end means and located at opposite ends of said column, said end members having shoulders extending radially relative to said axis, and
    a non-conductive filament winding wrapped around said plastic film barrier, said end members and said components, engaging said shoulders and applying an axially-directed compressive force through said shoulders on said plurality of electrical components and said end members to maintain said electrical connection thereof, said plastic film barrier separating said non-conductive filament winding from said electrical components.

13. An electrical device according to claim 12 wherein each said film is polypropylene.

14. An electrical device according to claim 12 wherein each said filament winding comprises resin soaked glass fibers.

15. An electrical device according to claim 12 wherein each said plastic film comprises a plastic sheet wrapped about said electrical components.

16. An electrical device according to claim 15 wherein each said plastic film comprises two superposed layers.

17. An electrical device according to claim 16 wherein each said layer is about 0.0005 inch thick.

18. An electrical device according to claim 14 wherein each said non-conductive filament winding is wrapped about said electrical components and said end members of each said electrical assembly while said electrical components and said end members of the respective electrical assembly are axially compressed.

19. An electrical device according to claim 12 wherein said electrical components are generally cylindrical metal oxide varistor blocks.

20. A surge arrester, comprising:
a plurality of arrester modules arranged in an end-to-end array, each of said modules including:
  a plurality of generally cylindrical, metal oxide varistor blocks aligned in a column along an axis and having axially directed ends, said varistor blocks being in electrical connection with one another through said axially directed ends,
  first and second generally cylindrical, conductive terminals at opposite ends of each said column, each said terminal having a first axial end in contact with one of said varistor blocks, an opposite second axial end with an internally threaded socket and a shoulder extending radially relative to said axis, said varistor blocks and said terminals having substantially equal transverse diameters,
  a plastic film barrier laterally surrounding and tightly engaging said varistor blocks and adjacent portions of said terminals, and
  a non-conductive filament winding wrapped around said plastic film barrier, said varistor blocks and said terminals, engaging said shoulders and applying an axially-directed compressive force through said shoulders on said varistor blocks and said terminals to maintain electrical connection thereof, said plastic film barrier separating said non-conductive filament winding from said varistor blocks;
conductive externally threaded studs electrically and mechanically coupling each adjacent pair of said modules by threadedly engaging said sockets, said mechanical coupling resisting axial movement between said modules; and
elastomeric weathershed means, enclosing said modules, for protecting said modules, said watershed means having a substantially cylindrical throughbore with a diameter substantially equal to transverse diameters of said modules.

21. A surge arrester, comprising:
an arrester module including
  a plurality of generally cylindrical, metal oxide varistor blocks aligned in a column along an axis and having axially directed ends, said varistor blocks being in electrical connection with one another through said axially directed ends,
  first and second generally cylindrical, conductive terminals at opposite ends of each said column, each said terminal having a first axial end in contact with one of said varistor blocks, and opposite second axial end with an internally threaded socket and a shoulder extending radially relative to said axis, said varistor blocks and said terminals having substantially equal transverse diameters,
  a plastic film barrier laterally surrounding and tightly engaging said varistor blocks and adjacent portions of said terminals, and
  a non-conductive filament winding wrapped around said plastic film barrier, said varistor blocks and said terminals, engaging said shoulders and applying an axially-directed compressive force through said shoulders on said varistor blocks and said terminals to maintain electrical connection thereof, said plastic film barrier separating said non-conductive filament winding from said varistor blocks;
conductive externally threaded studs threadedly engaging said sockets; and
elastomeric weathershed means, enclosing said module, for protecting said module, said weathershed means having a substantially cylindrical throughbore with a diameter substantially equal to a transverse diameter of said module.

22. A surge arrestor according to claim 21 wherein said non-conductive filament winding is a wet epoxy coated fiberglass wrapped about said varistor blocks and said terminals while said varistor blocks and said terminals are axially compressed.

* * * * *